United States Patent
Miki

(10) Patent No.: US 6,256,250 B1
(45) Date of Patent: Jul. 3, 2001

(54) POWER SUPPLY CIRCUIT

(75) Inventor: Atsunori Miki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/507,672

(22) Filed: Feb. 22, 2000

(30) Foreign Application Priority Data

Feb. 23, 1999 (JP) .................................................. 11-045343

(51) Int. Cl.[7] ...................................................... G11C 7/00
(52) U.S. Cl. .................... 365/226; 365/227; 365/189.11; 365/191; 365/189.09; 327/536
(58) Field of Search .............................. 365/189.01, 226, 365/227, 189.11, 191, 189.09; 327/536

(56) References Cited

U.S. PATENT DOCUMENTS

| | | | |
|---|---|---|---|
| 5,262,999 | * 11/1993 | Etoh et al. ............................. | 365/226 |
| 5,526,313 | * 6/1996 | Etoh et al. ............................. | 365/205 |
| 5,610,863 | * 3/1997 | Yamad ............................. | 365/189.09 |
| 6,121,821 | * 9/2000 | Miki ..................................... | 327/536 |
| 6,137,732 | * 10/2000 | Inaba ................................. | 365/189.09 |

FOREIGN PATENT DOCUMENTS

| | | |
|---|---|---|
| 401097165A | * 4/1989 | (JP) . |
| 1-140698 | 9/1989 | (JP) . |
| 411353899A | * 12/1999 | (JP) . |

OTHER PUBLICATIONS

Japanese Office Action dated Apr. 18, 2000, with partial translation.

* cited by examiner

*Primary Examiner*—Viet Q. Nguyen
(74) *Attorney, Agent, or Firm*—McGinn & Gibb, PLLC

(57) ABSTRACT

Disclosed is a power supply circuit that, at a first node, generates a read voltage and a write voltage for a memory cell. According to the present invention, a power supply circuit comprises:

a boosting circuit, for boosting to a first voltage the voltage at the first node when a writing operation is initiated;

a capacitor, one end of which is connected to the first node and the other end of which is connected to a second node;

a driver circuit, for changing from a second to a third voltage the voltage at the first node when a reading operation is initiated; and a connection circuit, for electrically connecting the first node to the second node when the writing operation is initiated.

6 Claims, 4 Drawing Sheets

POWER SUPPLY CIRCUIT

BACKGROUND OF THE INVENTION

1. Field of the Invention

The present invention relates to a power supply circuit for supplying a voltage to a memory cell during a data writing process, and relates in particular to a power supply circuit for improving a voltage boosting speed.

2. Description of the Prior Art

In order to provide increased integration when manufacturing integrated circuits, the sizes of circuit elements are constantly being reduced. One such conventional integrated circuit is a power supply circuit that is especially employed to generate a voltage for writing, erasing or reading data, and to supply the voltage to individual peripheral circuits and to a memory cell.

FIG. 6 is a block diagram showing a conventional power supply circuit. In the conventional power supply circuit, connected to the anode (node NA1) of a boosting capacitor Cboost 1 is a boosting driver circuit 11, and connected to its cathode (node NC1) are a pre-charge circuit 12 and a boosting circuit 13. Also connected to the node NC1 are various voltage generation circuits and a decoder. When data reading, writing or erasing is performed for a memory cell, a voltage equal to or higher than power supply voltage Vcc is supplied by the node NC1 to the voltage generation circuits and to the decoder. The voltage generation circuits control and generate, for example, verification voltages, compaction voltages or drain voltages.

FIG. 7 is a circuit diagram showing the boosting driver circuit 11, which is part of the conventional power supply circuit. A NAND circuit 14 is provided in the boosting driver circuit 11 to process the potentials input at terminals S11 and S12, and to output the result to the node NA1.

In the pre-charge circuit 12, a P-channel transistor is connected to the node NC1 and the power source Vcc. When the boosting circuit 13 and the boosting driver circuit 11 are inactive, the power voltage Vcc is supplied to the node NC1 by the pre-charge circuit 12.

FIG. 8 is a timing chart showing the memory cell reading process performed by the conventional power supply circuit.

In the thus arranged conventional power supply circuit, the boosting circuit 13 and the boosting drive circuit 12 are inactive before the memory cell reading process is initiated, and, as is shown in FIG. 8, constant pre-charging of the node NC1 with the voltage Vcc is performed by the pre-charge circuit 12. As is further shown in FIG. 8, at the terminals S11 and S12 the potentials are Vcc, and at the node NA1 the potential is the ground potential Vss.

When the reading of data from a memory cell actually begins, as is shown in FIG. 8 the potential at the terminal S11 goes to Vss while the potential at the terminal S12 goes to Vcc, and the pulse Vcc is applied to the node NA1. That is, after the potential has been changed from Vss to Vcc, the boosting driver circuit 11 supplies it to the node NA1. Therefore, as is shown in FIG. 8, the boosting capacitor Cboost 1 raises the potential at the node NC1 to Vboost 1 (>Vcc), which is supplied to the gate of the memory cell by the decoder, and data are read from the memory cell. At this time, the boosting circuit 13 is inactive.

In the data writing or erasing performed in the memory cell, a voltage Vcp (>Vcc) is generated by the boosting circuit 13 and is supplied to the node NC1. At this time, since the power source voltage Vcc is supplied to the terminals S11 and S12, the voltage at the node NA1 is fixed at Vss.

When data is to be written, the voltage Vcp supplied to the node NC1 is transmitted to the gate of the memory cell.

However, in the conventional power supply circuit, when the boosting circuit 13 is activated the boosting capacitor Cboost 1 imposes a capacitive load on the boosting circuit 13, and the boosting speed of the voltage Vcp is reduced. And when the boosting speed is reduced, the time required to write and erase data in a memory cell is extended, and the consumption of current is increased.

BRIEF SUMMARY OF THE INVENTION

OBJECT OF THE INVENTION

It is, therefore, one object of the present invention to provide a power supply circuit that can facilitate the rapid writing and erasing of data, and that can reduce the consumption of current.

SUMMARY OR THE INVENTION

To achieve the above object, according to the present invention, a power supply circuit, which generates a read voltage and a write voltage for a memory cell at a first node, comprises:

a boosting circuit, for boosting a voltage at the first node to a first voltage when a writing operation is initiated;

a capacitor, one end of which is connected to the first node and the other end of which is connected to a second node;

a driver circuit, for changing the voltage at the first node from a second voltage to a third voltage when a reading operation is initiated; and a connection circuit, for electrically connecting the first node to the second node when the writing operation is initiated.

BRIEF DESCRIPTION OF THE DRAWINGS

The above-mentioned and other objects, and features and advantages of this invention will become more apparent during the course of the subsequent, detailed description of the invention that is given while referring to the accompanying drawings, of which.

DETAILED DESCRIPTION OF THE INVENTION

The preferred embodiment of the present invention will now be described while referring to the accompanying drawings.

Figure 1:
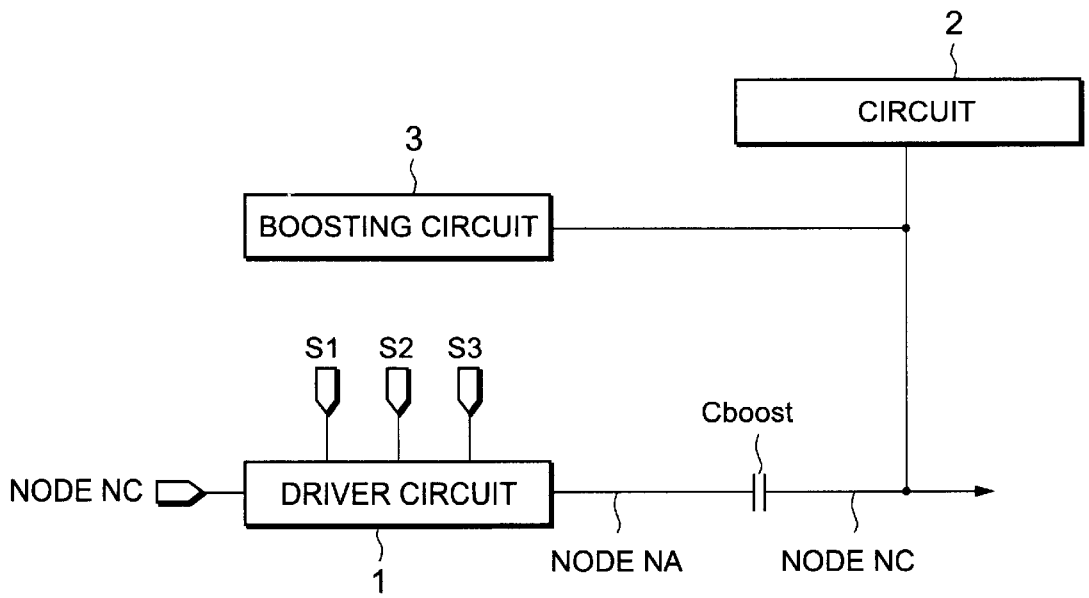
FIG. 1 is block diagram illustrating a power supply circuit according to one embodiment of the present invention.

FIG. 1 is a block diagram illustrating a power supply circuit according to the embodiment of the present invention.

In this embodiment, a boosting driver circuit 1 is connected to the anode (node NA) of a boosting capacitor Cboost, and a pre-charge circuit 2 and a boosting circuit 3 are connected to the cathode (node NC) of the boosting capacitor Cboost. Various voltage generation circuits and a decoder are also connected to the node NC, and when the reading, writing or erasing of data in a memory cell is begun, a voltage equal to or higher than a power source voltage Vcc is transmitted to the voltage generation circuit and the decoder by the node NC.

Figure 2:
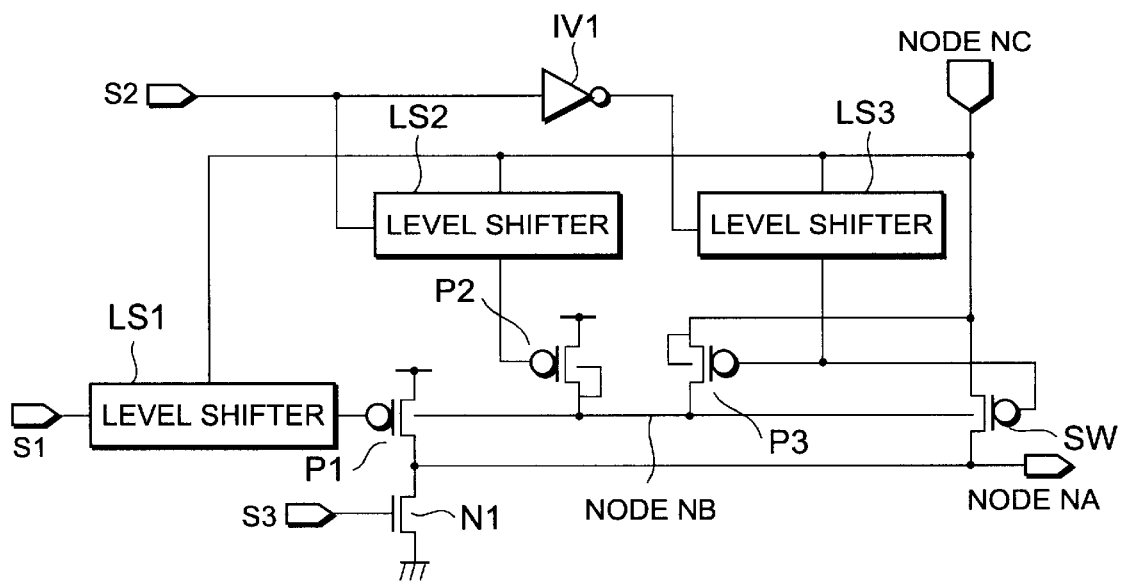
FIG. 2 is a circuit diagram illustrating a boosting drive circuit according to the embodiment of the present invention.

FIG. 2 is a circuit diagram showing the boosting driver circuit 1 according to the embodiment of the present invention. Three level shifters, LS1, LS2 and LS3, are provided for the boosting driver circuit 1, and are connected to the node NC. A terminal S1 is connected to the input terminal of the level shifter LS1, and a terminal S2, which is connected to the input terminal of the level shifter LS2, is also connected, via an inverter IV1, to the input terminal of the level shifter LS3.

The gate of a P-channel transistor P1 is connected to the output terminal of the level shifter LS1; the gate of a P-channel transistor P2 is connected to the output terminal of the level shifter LS2; and the gate of a P-channel transistor P3 is connected to the output terminal of the level shifter LS3. A power source voltage Vcc is supplied to the sources of the transistors P1 and P2, and the source of the transistor P3 is connected to the node NC.

Also provided is an N-channel transistor N1, the drain of which is connected to the drain of the transistor P1 and the source of which is grounded, that is connected at its gate to the terminal S3. The node NA is connected to the junction of the drain of the transistor P1 and the drain of the transistor N1.

In addition, a switch SW is provided, a P-channel transistor, for short-circuiting or releasing the node NA and the node NC. The gate of the switch SW is connected to the output terminal of the level shifter LS3, and the drains of the transistors P2 and P3 are connected in common to the node NB, which is located along the channel between the transistor P1 and the switch SW.

Before reading is begun, the voltages at the terminals S1 and S2 are set, for example, to Vcc, and when reading is begun, the voltages are changed to Vss. The voltage at the terminal S2 remains unchanged at Vss before and after the reading is performed.

Figure 3:
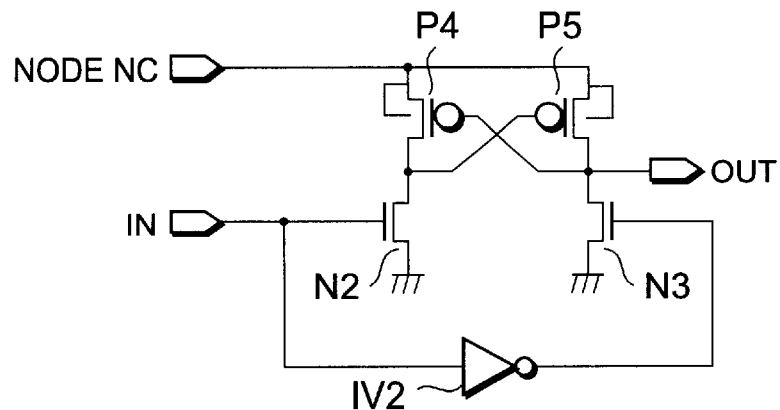
FIG. 3 is a circuit diagram illustrating a level shifter according to the embodiment of the present invention.

FIG. 3 is a circuit diagram showing one of the level shifters according to this embodiment. The level shifters LS1 to LS3 have the same structure, and only the signals that are input to their input terminals IN differ. The level shifter LS1 receives a signal from the terminal S1, the level shifter LS2 receives a signal from the terminal S2, and the level shifter LS3 receives an inverted signal from the terminal S2. The gate of an N-channel transistor N2 and the input terminal of an inverter IV2 are connected to the input terminal IN, and the source of the transistor N2 is grounded. P-channel transistors P4 and P5 are also provided, and their sources are connected to the node NC.

The drains of the transistors N2 and P4 and the gate of the transistor P5 are connected in common. In addition, an N-channel transistor N3 is provided, the gate of which is connected to the output terminal of the inverter IV2 and the source of which is grounded. The drains of the transistors N3 and P5 and the gate of the transistor P4 are connected in common, and an output terminal OUT is connected at their junction.

Figure 4:
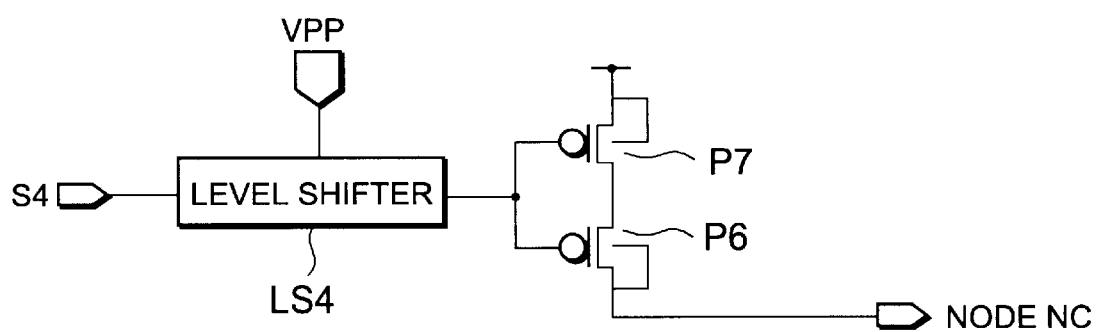
FIG. 4 is a circuit diagram illustrating a pre-charge circuit according to the embodiment of the present invention.

FIG. 4 is a circuit diagram showing the pre-charge circuit 2 according to the embodiment of the present invention. In the pre-charge circuit 2, P-channel transistors P6 and P7 are provided and are connected in series between the node NC and a signal line along which the power source voltage Vcc is supplied. The gates of the transistors P6 and P7 are connected in common to the output terminal of a level shifter LS4, and a terminal S4 is connected to the input terminal of the level shifter LS4, to which a voltage VPP is supplied.

The structure of the level shifter LS4 is the same as that shown in FIG. 3, except that a signal from the terminal S4 is transmitted to the input terminal IN. A voltage VPP, which is equal to or higher than the voltage at the node NC, is supplied to the level shifter LS4.

When the boosting circuit 3 and the boosting driver circuit 1 are inactive, the power source voltage Vcc is supplied to the node NC by the pre-charger circuit 2. And when the boosting circuit 3 and the boosting driver circuit 1 are active, the transistors P6 and P7 are rendered off and the connection of the power source Vcc to the node NC is opened.

Figure 5:
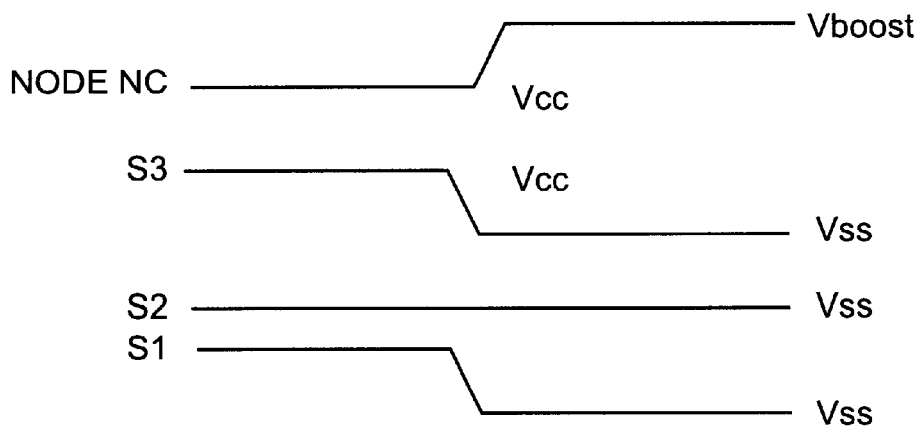
FIG. 5 is a timing chart showing a reading operation for a memory cell according to the embodiment of the present invention.
Figure 6:
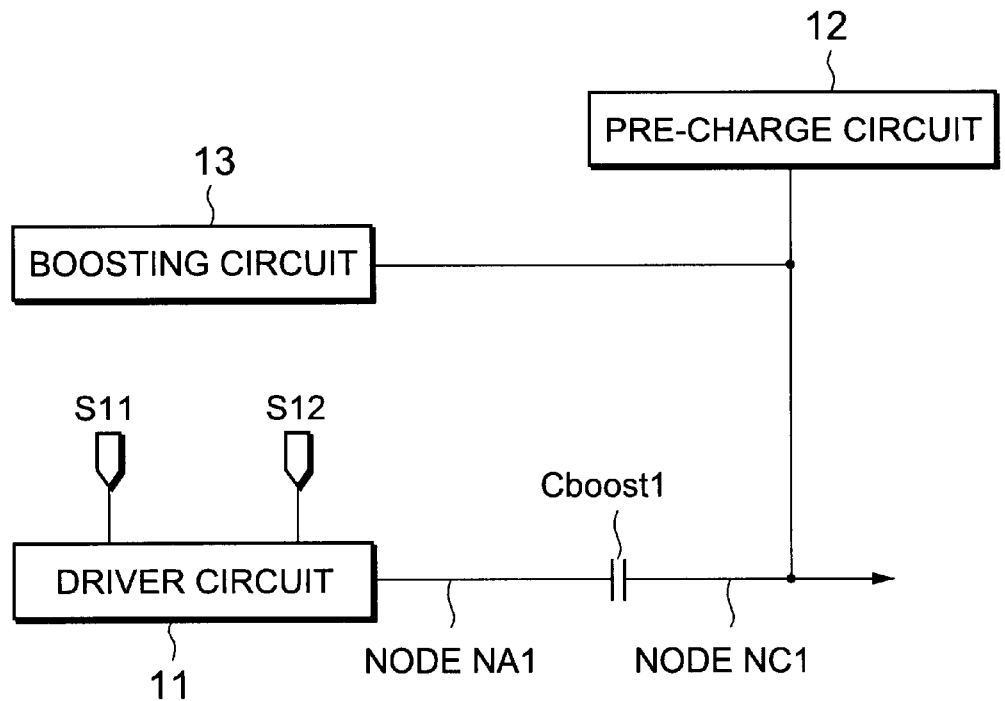
FIG. 6 is a block diagram illustrating a conventional power supply circuit.
Figure 7:
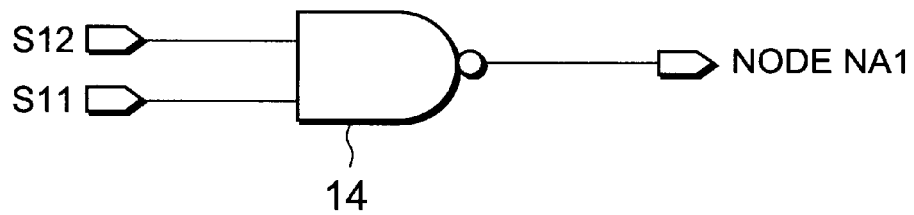
FIG. 7 is a circuit diagram illustrating a boosting driver circuit in the conventional power supply circuit.
Figure 8:
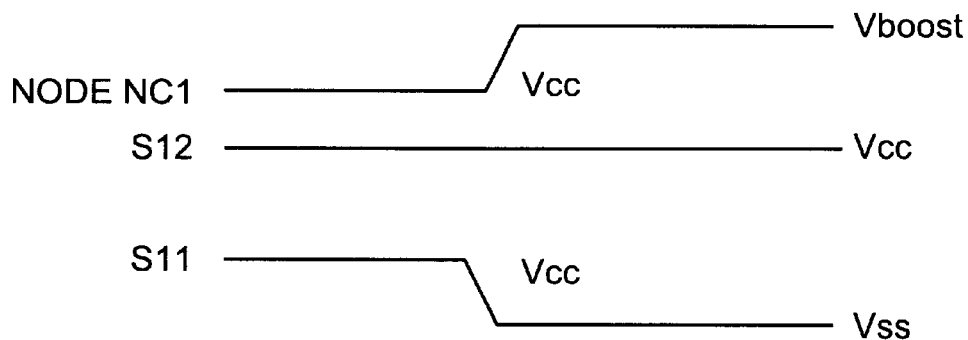
FIG. 8 is a timing chart for the power supplied by a conventional power supply circuit for the performance of a reading operation in a memory cell.

The operation performed by the thus arranged power supply circuit in this embodiment will now be described. FIG. 5 is a timing chart showing a data reading process for a memory cell according to this embodiment.

Before the reading of data from a memory cell is begun, the boosting circuit 3 and the boosting drive circuit 1 are inactive, and, as is shown in FIG. 5, the node NC is constantly pre-charged to the potential Vcc by the pre-charge circuit 3. Furthermore, as is shown in FIG. 5, since the potential at the terminal S2 is Vss and the transistor P2 is in the ON state while the transistor P3 is in the OFF state, the potential at the node NB is Vcc. In addition, the potential at the terminal S3 is Vcc, and the potential at the node NA is the ground potential Vss.

When the reading of data from the memory cell actually begins, as is shown in FIG. 5, the potentials at the terminals S1 and S3 are changed to Vss, and the potential Vcc is applied to the node NA. That is, the potential is changed from Vss to Vcc and is supplied to the node NA by the boosting driver circuit 1. As a result, again as is shown in FIG. 5, the potential at the node NC is boosted to potential Vboost (>Vcc) by the boosting capacitor Cboost. The potential Vboost is then supplied via the decoder to the gate of the memory cell, and data in the memory cell are read. At this time, the switch SW is off, the connection of the node NA to the node NC is opened, and the boosting circuit 3 is inactive. Further, since the potential at the base of the transistor P1 is the potential Vcc at the node NB, the transistor P1 is not adversely affected by the back biasing characteristic.

When the writing of data to the memory cell or the erasing of data from the memory cell is initiated, the voltage Vcp (>Vcc) is generated by the boosting circuit 3 and is supplied to the node NC. During the data writing process, the voltage Vcp is supplied to the various voltage generation circuits and the gate of the memory cell, while during in the data erasing process, the voltage Vcp is supplied to the various voltage generation circuits. At this time, since the power source voltage Vcc is supplied to the terminal S2, the switch SW is turned on and The transistor P3 is set to ON, the transistor P2 is set to OFF, and the potential at the node NB is changed to Vcp. Therefore, the node NA and the node NC are short-circuited.

As a result, since the boosting capacitor Cboost does not impose a capacitive load on the boosting circuit 3, a high boosting speed can be obtained. Further, a backflow of consumed current from the potential Vcp to the potential Vcc does not occur. It should also be noted that the boosting driver circuit 1 is inactive.

In this embodiment, the entire capacitive load Csw, which is parasitic to the switches SW and the level shifters LS1 to LS3 in the driver circuit 1, is a considerably smaller value than the boosting capacitance Cboost; specifically, its value three or more digits smaller. Therefore, the entire capacitive load Csw does not adversely affect the boosting capacity of the boosting circuit 3. And as a result, the boosting speed is increased, compared with the conventional art, while the consumption current is reduced.

As is described above in detail, according to the present invention, potential control means is provided for matching the potentials at the anode and the cathode of the boosting capacitance when the boosting circuit is operated. Therefore, the boosting capacitance is prevented from acting as a capacitive load in the boosting circuit, and the data writing and erasing speed can be increased. Accordingly, current consumption can be reduced.

Although the invention has been described with reference to specific embodiments, this description must not be construed as limiting in any way the scope of the invention. And since while referring to the description of the invention, various modifications of the disclosed embodiments will become apparent to persons skilled in the art, it is therefore contemplated that the appended claims will cover any modifications or embodiments that fall within the true scope of the invention.

What is claimed is:

1. A power supply circuit comprising:

a boosting capacitor;

a boosting circuit for boosting a potential at a cathode of said boosting capacitor; and potential control means for, when said boosting circuit is activated, matching a potential at an anode of said boosting capacitor and said potential at said cathode.

2. A power supply circuit according to claim 1, wherein said potential control means includes short-circuit means for short-circuiting said anode and said cathode of said boosting capacitor.

3. A power supply circuit according to claim 2, further comprising: a pre-charge circuit for, when said boosting circuit has not been activated, employing a power source voltage to pre-charge said cathode of said boosting capacitor.

4. A power supply circuit according to claim 3, wherein said pre-charge circuit includes a switching device that is connected to an interval between a signal line along which said power source voltage is supplied and said cathode of said boosting circuit.

5. A power supply circuit according to claim 2, further comprising: a driver circuit for, when said boosting circuit has not been activated, maintaining a predetermined potential at said anode of said boosting capacitor.

6. A power supply circuit according to claim 2, wherein said short-circuit means includes a field-effect transistor, which is connected at an interval between said anode and said cathode of said boosting capacitor, and control means, for controlling a potential at a gate of said field-effect transistor.

* * * * *